(12) United States Patent
Mo

(10) Patent No.: US 8,436,420 B2
(45) Date of Patent: May 7, 2013

(54) SEMICONDUCTOR DEVICE AND MANUFACTURING METHOD THEREOF

(75) Inventor: Kyu Hyun Mo, Nowon-gu (KR)

(73) Assignee: Dongbu Hitek Co., Ltd., Seoul (KR)

( * ) Notice: Subject to any disclaimer, the term of this patent is extended or adjusted under 35 U.S.C. 154(b) by 927 days.

(21) Appl. No.: 12/250,872

(22) Filed: Oct. 14, 2008

(65) Prior Publication Data

US 2011/0168983 A1    Jul. 14, 2011

(30) Foreign Application Priority Data

Nov. 7, 2007    (KR) .................. 10-2007-0112932

(51) Int. Cl.
*H01L 29/66*    (2006.01)

(52) U.S. Cl.
USPC ............ 257/330; 257/E51.039; 257/E21.618; 977/742; 977/759; 977/932; 438/589

(58) Field of Classification Search .......... 257/328–330, 257/E21.618, E21.633, 750–752, 759, 773–774, 257/784, 932; 438/212, 268, 259, 270, 271, 438/589

See application file for complete search history.

(56) References Cited

U.S. PATENT DOCUMENTS

| 7,652,341 B2 * | 1/2010 | Kaneko et al. ................ 257/410 |
| 2005/0012163 A1 * | 1/2005 | Wei et al. ...................... 257/407 |
| 2007/0069307 A1 * | 3/2007 | Eda ................................ 257/374 |
| 2007/0187729 A1 * | 8/2007 | Park et al. ..................... 257/288 |

FOREIGN PATENT DOCUMENTS

| JP | 2006-024617 | 1/2006 |
| KR | 10-2006-0024193 A | 3/2006 |

OTHER PUBLICATIONS

Machine Translation of reference JP 2006-024617.*

* cited by examiner

*Primary Examiner* — Julio J Maldonado
*Assistant Examiner* — Sonya D McCall Shepard
(74) *Attorney, Agent, or Firm* — Saliwanchik, Lloyd & Eisenschenk

(57) ABSTRACT

Disclosed are a semiconductor device and a manufacturing method thereof. The semiconductor device can include a recess formed in an active area of a semiconductor substrate, an insulating layer formed in the recess, a source electrode and a drain electrode spaced apart from the source electrode on the insulating layer, a carbon nanotube layer formed between the source and drain electrodes, an oxide layer pattern covering at least the carbon nanotube layer, and a gate electrode formed on the oxide layer pattern.

8 Claims, 5 Drawing Sheets

SEMICONDUCTOR DEVICE AND MANUFACTURING METHOD THEREOF

CROSS-REFERENCE TO RELATED APPLICATION

The present application claims the benefit under 35 U.S.C. §119 of Korean Patent Application No. 10-2007-0112932, filed Nov. 7, 2007, which is hereby incorporated by reference in its entirety.

BACKGROUND

With the rapid development of information technologies and the popularization of information media such as computers, semiconductor devices have made rapid progress. In functional aspects, the semiconductor device has tended toward high integration. Accordingly, various methods haven been studied and developed in order to reduce the feature size of individual devices formed on a substrate and to maximize the performance of the devices. Among such methods, a FET (field effect transistor) fabricated through CMOS technology has the highest competitiveness because it can improve the integration degree of devices based on a silicon semiconductor technology. However, the size of the FET is scaled down as the device has become highly integrated, so the performance or reliability of the device is degraded.

BRIEF SUMMARY

Embodiments of the present invention provide a semiconductor device using carbon nanotubes and a manufacturing method thereof.

In an embodiment, a semiconductor device is provided having a micro size by forming a channel including a carbon nanotube between source and drain electrodes. According to the embodiment, the semiconductor device includes a recess formed in an active area of a semiconductor substrate, an insulating layer formed in the recess, a source electrode formed on the insulating layer and a drain electrode spaced apart from the source electrode, a carbon nanotube layer formed between the source and drain electrodes, an oxide layer pattern covering at least the carbon nanotube layer, and a gate electrode formed on the oxide layer pattern.

In another embodiment, a manufacturing method of a semiconductor device is provided, which can improve performance of a semiconductor device and simplify a manufacturing process by removing an ion implantation process, a silicide formation process and the like. According to an embodiment, the manufacturing method of the semiconductor device can include forming a recess by etching a semiconductor substrate; forming an insulating layer in the recess; forming a metal layer on the insulating layer and patterning the metal layer to form a source electrode and a drain electrode spaced apart from the source electrode; creating electric field between the source and drain electrodes; forming a carbon nanotube layer between the source and drain electrodes using the electric field; forming a gate oxide layer pattern on the carbon nanotube layer; and forming a gate electrode on the gate oxide layer pattern.

Since the semiconductor manufacturing process of the embodiment does not require an ion implantation process, a silicide formation process and the like, the manufacturing process can be simplified. Thus the manufacturing cost can be saved and the manufacturing time can be shortened, so that a product yield can be improved.

According to embodiments, because a source region, a drain region and the like are not formed in a semiconductor substrate through an ion implantation process, a depletion layer is not generated. Thus, although a channel width is minimized, a defect such as punch through does not occur and performance of the device can be improved.

Further, according to an embodiment, a line width of the semiconductor device can be minimized to several tens of nanometers to several nanometers, thereby achieving ultra-miniaturization and high integration of a semiconductor chip.

DETAILED DESCRIPTION

Figure 1:
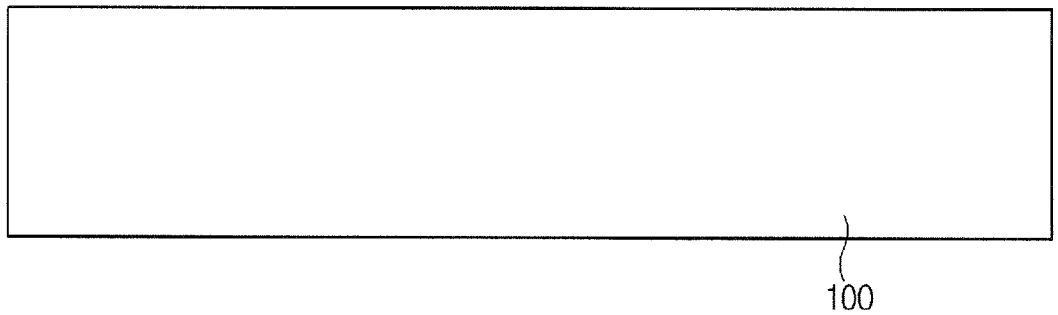
FIGS. 1 to 9 are cross-sectional views showing a method for manufacturing a semiconductor device according to certain embodiments of the present invention.

Hereinafter, a semiconductor device using carbon nanotube and a manufacturing method thereof according to embodiments will be described in detail with reference to accompanying drawings. Those skilled in the art can modify embodiments within the scope of the appended claims and their equivalents.

The terms "first" and "second" described below are used to distinguish members from each other and to represent at least two members, not to define the members. Accordingly, if the terms "first" and "second" are mentioned, a plurality of members is provided, and the members can be selectively or alternatively used. The size (dimension) of elements shown in the drawings may be magnified for the purpose of clear explanation and the real size of the elements may be different from the size of elements shown in drawings. In addition, the present invention may not include all the elements shown in the drawings and may not be limited thereto. The elements except for essential elements of the present invention can be omitted or added without limitation.

In the description of an embodiment, it will be understood that when a layer (or film) is referred to as being 'on/above/over/upper' another layer or substrate, it can be directly on another layer or substrate, or intervening layers may also be present. Further, it will be understood that when a layer is referred to as being 'down/below/under/lower' another layer, it can be directly under another layer, or one or more intervening layers may also be present. In addition, it will also be understood that when a layer is referred to as being 'between' two layers, it can be the only layer between the two layers, or one or more intervening layers may also be present. Thus, the meaning thereof must be determined based on the scope of the embodiment.

A method for manufacturing a semiconductor device according to embodiments will be described with reference to FIGS. 1 to 9.

Referring to FIG. 1, a semiconductor substrate 100 can be prepared. The semiconductor substrate 100 can be any suitable semiconductor substrate known in the art.

Figure 2:
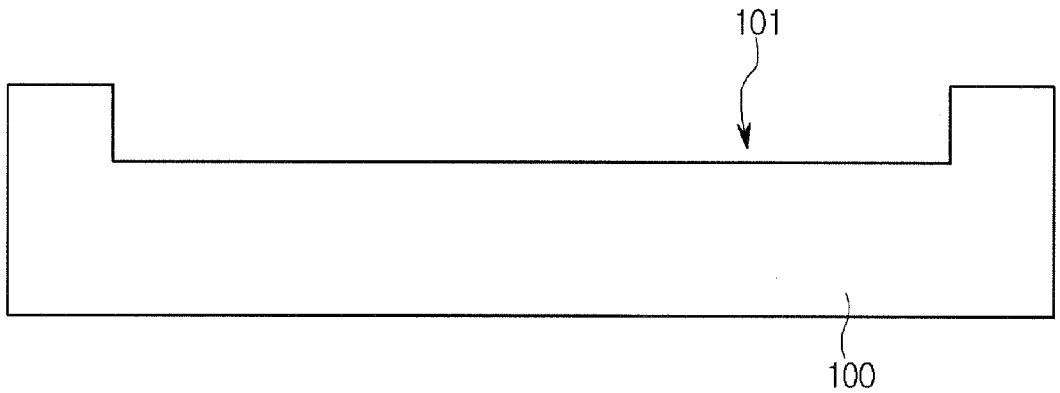

Then, as shown in FIG. 2, the semiconductor substrate 100 can be etched to form a recess 101. The recess 101 can be formed for an active region of the semiconductor substrate 100.

In an embodiment, the semiconductor substrate 100 can be etched through an RIE (reactive ion etching) process.

The recess 101 can be simultaneously formed when forming a trench of an isolation pattern of the semiconductor substrate 100. In detail, the recess 101 can include the active area and an isolation area around the active area.

In one embodiment, the recess 101 can be formed separately from the trench while being formed in the active area. That is, the recess 101 can be separate from the trench of an isolation pattern such that the recess is formed in the active area and the trench is formed in the isolation area. In another embodiment, the recess 101 can include the trench for the isolation area and the active area (see e.g. FIG. 9).

According to certain embodiments, the trench for the isolation pattern can be formed along the peripheral surface of the recess 101. In an embodiment, the recess 101 can have the same depth as that of the trench. In addition, the trench can be a shallow trench isolation pattern.

Figure 3:
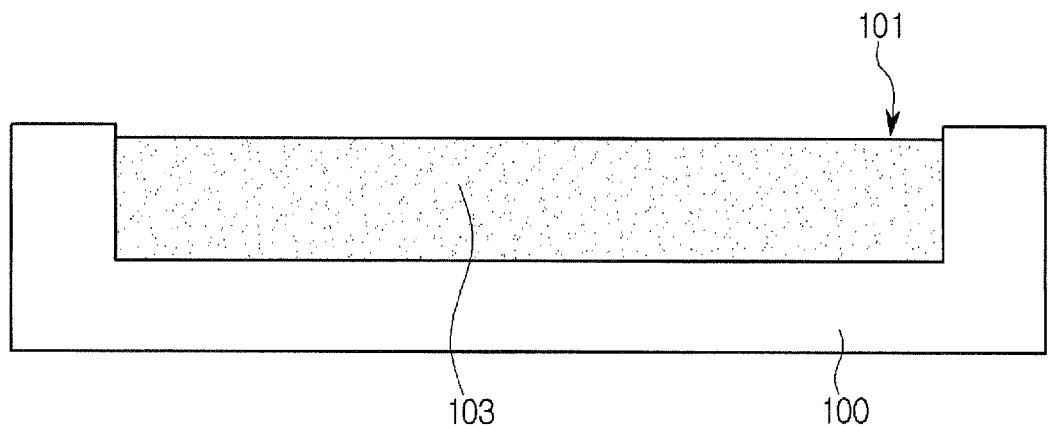

Then, referring to FIG. 3, an oxide layer 103 can be formed on the semiconductor substrate 100.

The oxide layer 103 includes material filled in the trench of the isolation pattern, and can be formed through a CVD (chemical vapor deposition) process.

After forming the oxide layer 103 such that the semiconductor substrate 100 is sufficiently covered by the oxide layer 103 and the recess 101 (and trench) are filled, the oxide layer 103 can be polished through a CMP (chemical mechanical polishing) process such that the semiconductor substrate 100 is exposed.

Figure 4:
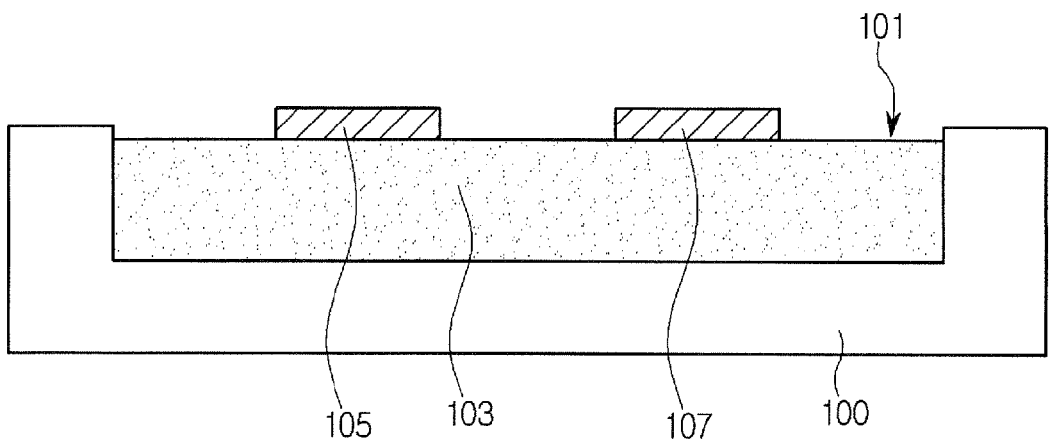

Referring to FIG. 4, a metal layer (not shown) can be formed on the oxide layer 103 and then patterned to form a source electrode 105 and a drain electrode 107, which are spaced apart from each other by a predetermined interval.

The metal layer can include, for example, at least one selected from the group consisting of Co, Mo, Ta, W, Ti, Ni, Al, Cu, Pt, Au and an alloy thereof.

According to certain embodiments, the interval between the source and drain electrodes 105 and 107 can be, for example, about 5 nm. In embodiments, the interval can range from about 5 nm to about 4 μm depending on desired device size.

Since the source and drain electrodes 105 and 107 include metal patterns, the interval of several nanometer can be formed therebetween using a nano technology.

Figure 5:
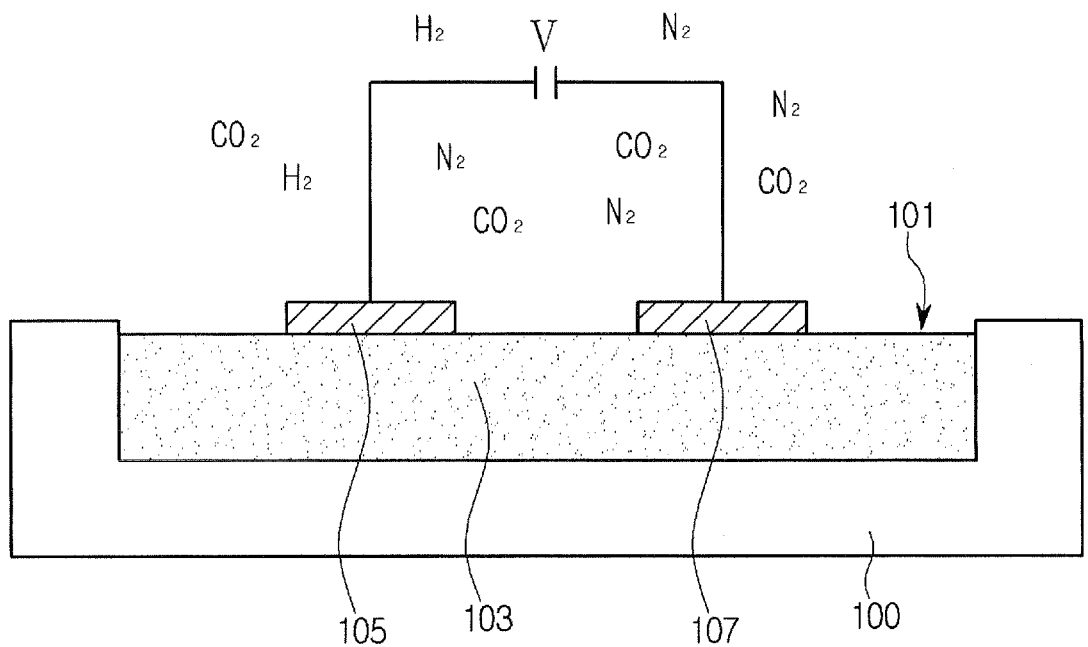

Then, as shown in FIG. 5, a voltage can be applied to the source and drain electrodes 105 and 107 through probing to create an electric field between the source and drain electrodes 105 and 107.

In a state in which the electric field is formed, $CO_2$, $H_2$ and $N_2$ gases can be supplied to the semiconductor substrate 100 while heating the semiconductor substrate 100.

For example, a 5 V to 15 V bias can be applied to the source and drain electrodes 105 and 107 while heating the semiconductor substrate 100 to a temperature between about 200 V to about 400 V.

Figure 6:
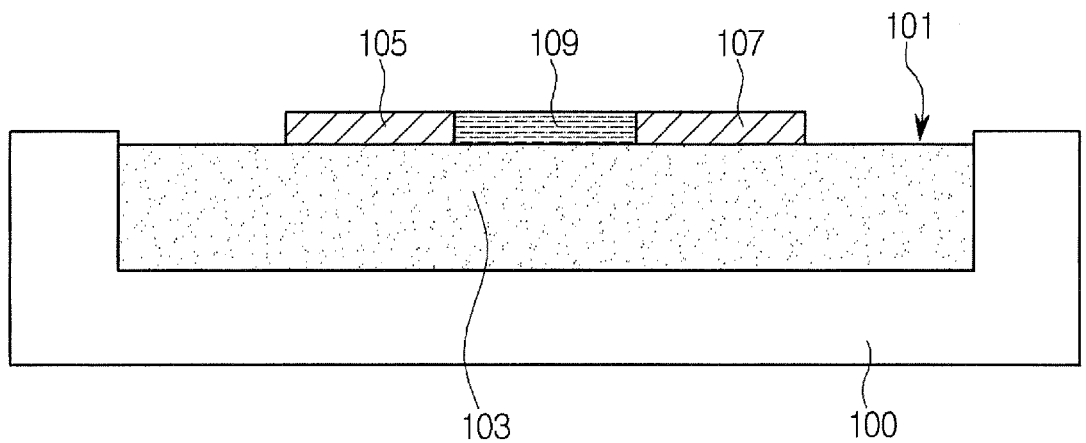

Referring to FIG. 6, a carbon nanotube can be grown between the source and drain electrodes 105 and 107 in the direction of the electric field to form a carbon nanotube layer 109.

The carbon nanotube layer 109 can be arranged in series relative to the source and drain electrodes 105 and 107. The carbon nanotube layer 109 makes contact with one side of the source electrode 105, one side of the drain electrode 107 facing the one side of the source electrode 105, and a part of the oxide layer 103 exposed between the source and drain electrodes 105 and 107.

In detail, if the source electrode 105 has a negative polarity and the drain electrode 107 has a positive polarity, one end of the carbon nanotube having a positive polarity is aligned toward the source electrode 105, and the other end of the carbon nanotube having a negative polarity is aligned toward the drain electrode 107.

Figure 7:
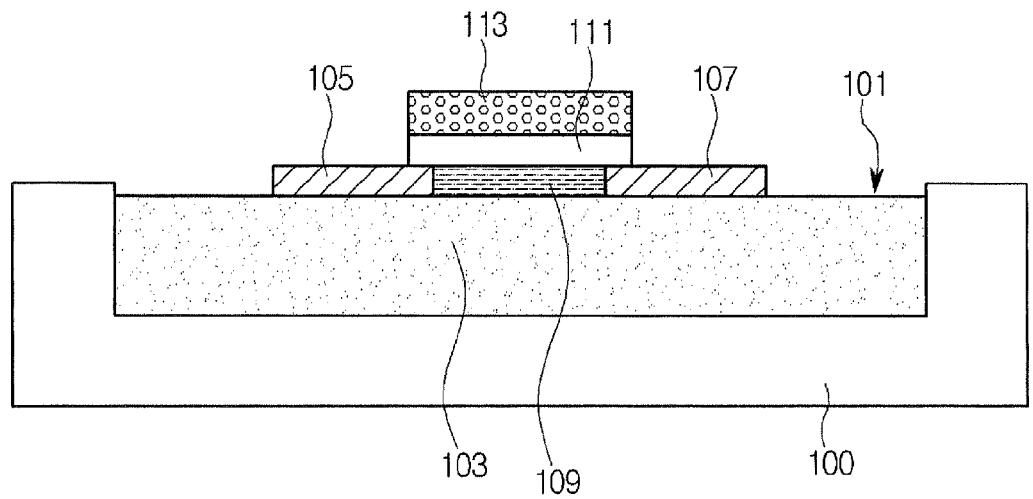

Next, referring to FIG. 7, an oxide layer can be formed on the source electrode 105, the drain electrode 107 and the carbon nanotube layer 109, which are formed on the semiconductor substrate 100. The oxide layer can be patterned to form a gate oxide layer pattern 111 that covers the carbon nanotube layer 109.

The gate oxide layer pattern 111 covers at least the nanotube layer 109. The gate oxide layer pattern 111 may extend to also cover portions of the source and drain electrodes 105 and 107.

A gate metal layer can be formed on the semiconductor substrate 100 and then patterned to form a gate electrode 113.

In one embodiment, the gate metal layer can include polysilicon.

In certain embodiments, the gate metal layer can include, for example, at least one selected from the group consisting of Co, Mo, Ta, W, Ti, Ni, Al, Cu, Pt, Au and an alloy thereof.

The gate electrode 113 can be formed on the gate oxide layer pattern 111 without making contact with the source and drain electrodes 105 and 107.

The gate oxide layer pattern 111 can be formed separately from the gate electrode 113. That is, the gate oxide layer pattern 111 can be formed before forming the gate metal layer.

In another embodiment, the gate oxide layer pattern 111 and the gate electrode 113 can be formed together by sequentially depositing the gate oxide layer and the gate metal layer and then patterning them.

For example, the gate oxide layer can be formed on the semiconductor substrate 100 and then the gate metal layer can be formed on the gate oxide layer. Next, the gate metal layer and the gate oxide layer can be etched, thereby forming the gate electrode 113 and the gate oxide layer pattern 111, which covers at least the carbon nanotube layer 109.

Figure 8:
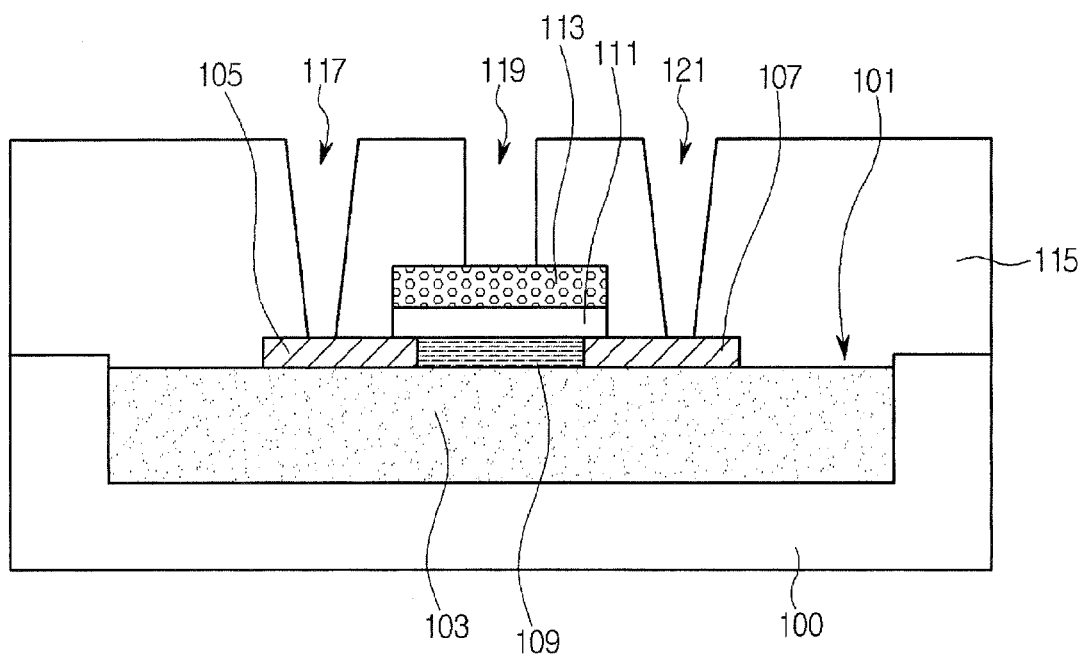

Then, referring to FIG. 8, an interlayer dielectric layer 115 can be formed on the entire surface of the semiconductor substrate 100 on which the source electrode 105, the drain electrode 107 and the gate electrode 113 are formed.

Next, the interlayer dielectric layer 115 is selectively etched to form a first hole 117 exposing a part of the source electrode 105, a second hole 119 exposing a part of the gate electrode 113, and a third hole 121 exposing a part of the drain electrode 107.

Figure 9:
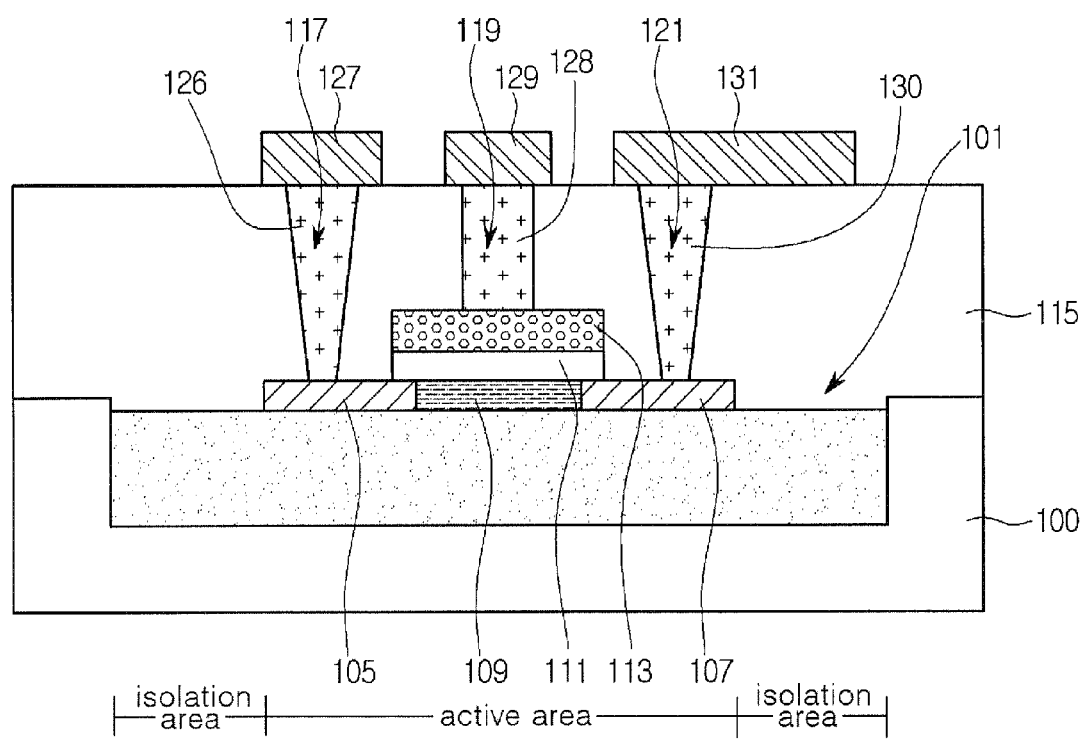

Then, as shown in FIG. 9, a first metal plug 126, a second metal plug 128, and a third metal plug 130 can be formed in the respective ones of the first to third holes 117, 119 and 121. Thereafter, a metal layer can be deposited on the entire surface of the interlayer dielectric layer 115 and then patterned to form a first interconnection 127, a second interconnection 129, and a third interconnection 131 making contact with respective ones of the first to third metal plugs 126, 128 and 130.

The first to third metal plugs 126, 128 and 130 can include, for example, tungsten.

In certain embodiments, the first to third interconnections 127, 129 and 131, can include aluminum.

Since embodiments of the semiconductor manufacturing process do not include an ion implantation process, a silicide formation process and the like, an existing complicated manufacturing process can be significantly simplified and defects occurring during the ion implantation process and the like can be avoided.

Further, by simplifying the semiconductor manufacturing process, embodiments can save manufacturing cost and shorten the manufacturing time to improve a product yield.

Furthermore, according to an embodiment, since the source region, the drain region and the like are not formed in the semiconductor substrate through an ion implantation process, a depletion layer is not generated. Thus, although a channel width is minimized, a defect such as punch through does not occur and performance of the device can be improved.

Moreover, according to an embodiment, a line width of the semiconductor device can be minimized to become several tens of nanometers to several nanometers, thereby achieving ultra-miniaturization and high integration of a semiconductor chip.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor device comprising:
    an insulating layer disposed in a recess formed in an active area of a semiconductor substrate;
    a source electrode disposed on the insulating layer;
    a drain electrode disposed on the insulating layer and spaced apart from the source electrode;
    a carbon nanotube layer provided between the source electrode and the drain electrode;
    an oxide layer pattern covering an entire upper surface of the carbon nanotube layer; and
    a gate electrode on the oxide layer pattern, the gate electrode being aligned with the oxide layer pattern such that the gate electrode covers the entire upper surface of the carbon nanotube layer between the source electrode and the drain electrode.

2. The semiconductor device according to claim 1, wherein the recess extends from the active area to include an isolation area of the semiconductor substrate around the active area such that the insulating layer disposed in the recess is provided in the active area and the isolation area.

3. The semiconductor device according to in claim 1, further comprising an isolation pattern in a trench along a peripheral surface of the insulating layer disposed in the recess.

4. The semiconductor device according to claim 3, wherein the recess has a depth equal to a depth of the trench.

5. The semiconductor device according to claim 1, wherein a carbon nanotube of the carbon nanotube layer is horizontally aligned relative to the semiconductor substrate.

6. The semiconductor device according to claim 1, further comprising:
    an interlayer dielectric layer covering the source, drain and gate electrodes on the semiconductor substrate, and having a first hole exposing a part of the source electrode, a second hole exposing a part of the gate electrode, and a third hole exposing a part of the drain electrode;
    a first plug in the first hole, a second plug in the second hole and a third plug in the third hole; and
    a first interconnection connected with the first plug, a second interconnection connected with the second plug, and a third interconnection connected with the third plug, wherein the first, second, and third interconnections are disposed on the interlayer dielectric layer.

7. The semiconductor device according to claim 1, wherein the drain electrode is spaced apart from the source electrode by about 5 nm.

8. The semiconductor device according to claim 1, wherein the drain electrode is spaced apart from the source electrode by between about 5 nm to about 4 μm.

* * * * *